US006788578B1

(12) United States Patent
Tang

(10) Patent No.: US 6,788,578 B1
(45) Date of Patent: Sep. 7, 2004

(54) CHARGE PUMP FOR CONDUCTIVE LINES IN PROGRAMMABLE MEMORY ARRAY

(75) Inventor: Kam-Fai Tang, Fremont, CA (US)

(73) Assignee: Turbo IC, Inc., San Jose, CA (US)

( * ) Notice: Subject to any disclaimer, the term of this patent is extended or adjusted under 35 U.S.C. 154(b) by 31 days.

(21) Appl. No.: 10/351,779

(22) Filed: Jan. 27, 2003

(51) Int. Cl.[7] .............................................. G11C 16/04
(52) U.S. Cl. .............................. 365/185.18; 365/185.23
(58) Field of Search ..................... 365/185.03, 185.05, 365/185.18, 185.23, 185.29, 185.33, 189.09

(56) References Cited

U.S. PATENT DOCUMENTS

| 4,667,312 | A |   | 5/1987  | Doung et al. ................ 365/189    |
|-----------|---|---|---------|-----------------------------------------|
| 4,829,482 | A |   | 5/1989  | Owen ..................... 365/185.23    |
| 4,905,314 | A |   | 2/1990  | Kato et al. .................. 327/589   |
| 5,012,132 | A |   | 4/1991  | Wang .......................... 327/541  |
| 5,138,190 | A |   | 8/1992  | Yamazaki et al. ........... 327/536      |
| 5,687,116 | A | * | 11/1997 | Kowshik et al. ........ 365/185.03       |
| 5,734,610 | A |   | 3/1998  | Pascucci ................. 365/185.23    |
| 5,963,462 | A | * | 10/1999 | Engh et al. ............. 365/185.29     |
| 6,046,626 | A |   | 4/2000  | Saeki et al. ................... 327/536 |
| 6,069,825 | A | * | 5/2000  | Tang ..................... 365/185.23    |
| 6,181,629 | B1|   | 1/2001  | Ogura .......................... 365/227 |
| 6,212,095 | B1|   | 4/2001  | Chevallier .................. 365/183    |
| 6,292,391 | B1| * | 9/2001  | Nojima .................. 365/185.05     |
| 6,320,797 | B1|   | 11/2001 | Liu ........................ 365/189.11  |
| 6,452,842 | B2| * | 9/2002  | Mullarkey ............. 365/189.09       |
| 6,549,474 | B2| * | 4/2003  | Liu ........................ 365/189.05  |

OTHER PUBLICATIONS

Tanzawa et al., "Circuit Techniques for a 1.8–V–Only NAND Flash Memory," IEEE Journal of Solid–State Circuits, vol. 37 No. 1, p. 84–89, Jan. 2002.

* cited by examiner

Primary Examiner—Trong Phan
(74) Attorney, Agent, or Firm—Andrei D. Popovici

(57) ABSTRACT

A self-decoding charge pump for charging conductive lines (word lines or bit lines) of a semiconductor programmable memory array such as an EEPROM includes: oscillator output capacitive coupling circuitry connecting an oscillator output to a first control node corresponding to a selected conductive line, for capacitively coupling voltage pulses from the oscillator output to the first control node while the conductive line is selected; control selective charge transfer circuitry connecting a high voltage source to a second control node through the first control node, for selectively transferring charge increments from the high-voltage source to the second control node while the conductive line is selected; conductive line charging control circuitry connecting the high voltage source to the conductive line and responsive to the second control node, for selectively transferring charge from the high voltage source to the conductive line while the conductive line is selected; and conductive line isolation circuitry connecting the conductive line to the second control node, for selectively charging the second control node from the conductive line while the conductive line is selected, and for preventing a charging of the conductive line from the second control node. The conductive line isolation device allows decoupling the pumping efficiency of the charge pump from the capacitance of the conductive line to be charged. The efficiency of the pump depends on the capacitance of the second control node (a primary pump output), rather than the capacitance of the conductive line itself (a secondary pump output). Since the second control node can have a much lower capacitance than the conductive line, the described charge pumps allow substantially improved pumping efficiencies.

15 Claims, 3 Drawing Sheets

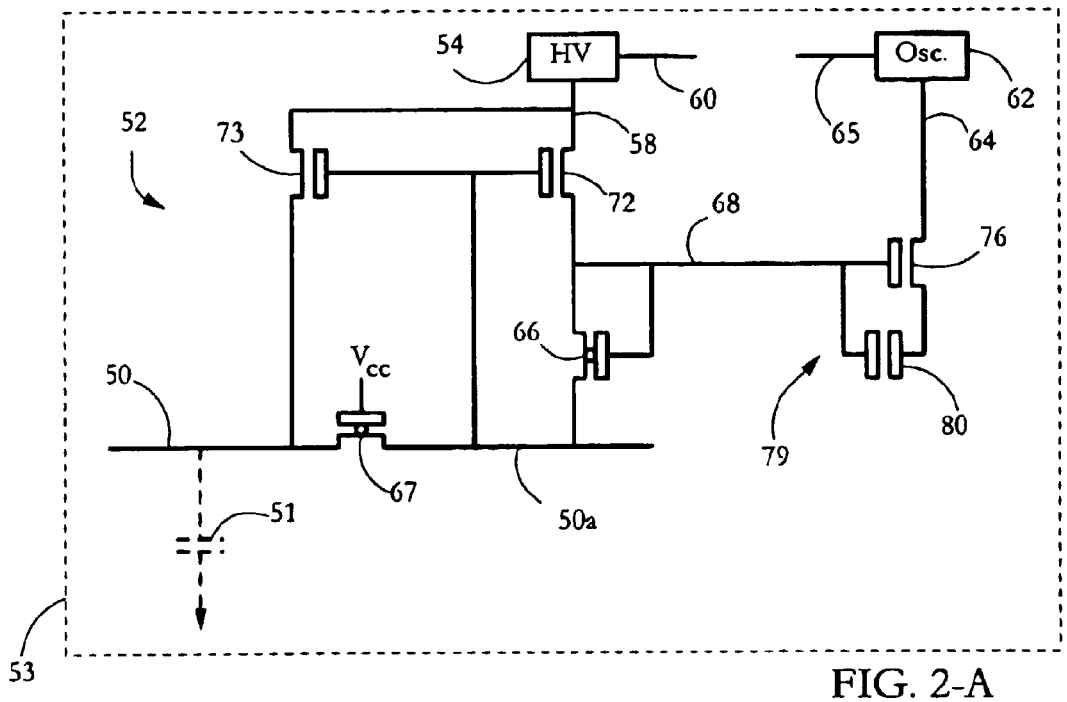
FIG. 2-A
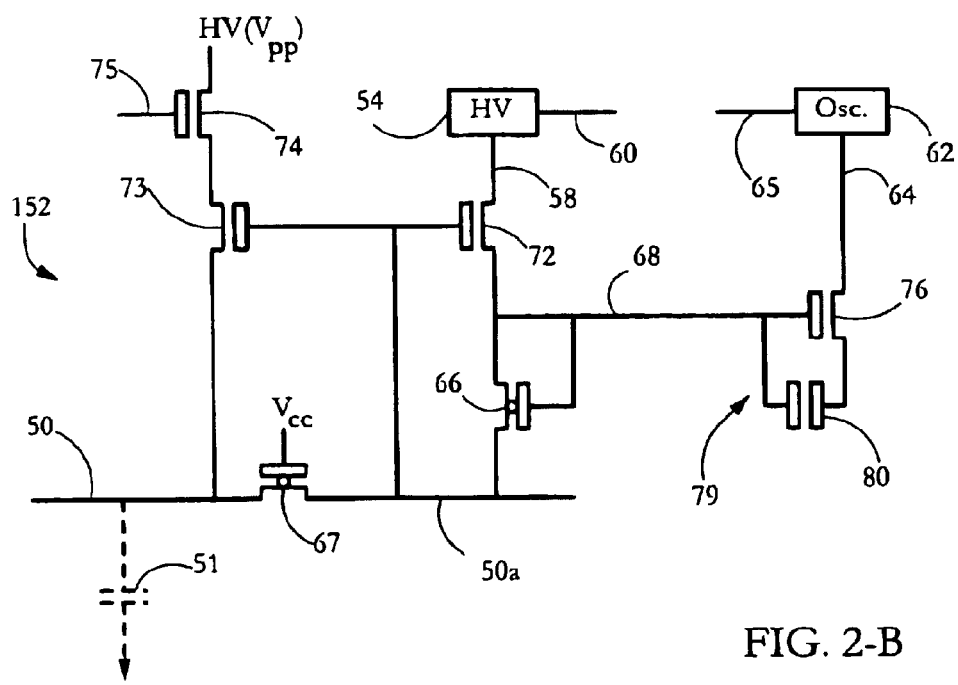
FIG. 2-B

US 6,788,578 B1

CHARGE PUMP FOR CONDUCTIVE LINES IN PROGRAMMABLE MEMORY ARRAY

FIELD OF THE INVENTION

This invention relates to semiconductor memory arrays, and in particular to charge pumps for providing programming voltages to conductive lines such as word lines and bit lines in programmable semiconductor memory arrays such as electrically erasable read-only memories (EEPROM).

BACKGROUND OF THE INVENTION

Programming floating-gate non-volatile semiconductor memories such as EEPROMs typically involves charging up memory word lines (x-lines) and bit lines selected for programming. Specialized on-chip charge pumps can be used for selectively charging selected word lines and bit lines. As the space between the high-voltage nodes and the carrier injection points of the charge pump circuit decreases, the problem of carrier injection into the circuit substrate increases in importance. Carrier injection or escape occurs when conductive channels in active devices are driven to switch potential from high to low or low to high. Carrier injection into the circuit substrate and subsequent migration of electrons to the high-voltage nodes of the circuit can significantly degrade the pumping efficiency of the charge pumps.

In U.S. Pat. No. 6,069,825, Tang describes a charge pump for conductive lines in programmable semiconductor memory arrays, which allows reduced carrier injection into the circuit substrate. When a conductive line is selected for programming, a passive capacitor can be used to couple voltage pulses from an oscillator to a charge transfer node and on to the conductive line. During time periods between the voltage pulses, charge increments are transferred from a high-voltage source to the conductive line through the charge transfer node. Increasing the efficiency of the charge pump described by Tang could be achieved by increasing the frequency of the oscillator, or by increasing the area of the capacitor used for coupling the voltage pulses to the charge transfer node. Increasing the oscillator frequency can lead to increased power consumption. At the same time, increasing the transfer capacitor area sufficiently to achieve a desired charge pump efficiency can require an unacceptable increase in the die area for the array.

SUMMARY OF THE INVENTION

The present invention provides an improved self-decoding apparatus integrated on a chip for selectively charging conductive lines of a programmable non-volatile memory array for programming. In the preferred embodiment, the apparatus comprises comprises: oscillator output capacitive coupling circuitry connecting an oscillator output to a first control node corresponding to a selected conductive line, the capacitive coupling circuitry being responsive to a voltage on the first control node, for capacitively coupling voltage pulses from the oscillator output to the first control node while the conductive line is selected; control selective charge transfer circuitry connecting a high voltage source to a second control node through the first control node, the second control node corresponding to the conductive line and having a lower capacitance than the conductive line, for selectively transferring charge increments from the high-voltage source to the second control node while the conductive line is selected, in response to the voltage pulses received at the first control node and in response to a voltage on the second control node; conductive line charging control circuitry connecting the high voltage source to the conductive line and responsive to the second control node, for selectively transferring charge from the high voltage source to the conductive line while the conductive line is selected, in response to the voltage on the second control node; and conductive line isolation circuitry connecting the conductive line to the second control node, for selectively charging the second control node from the conductive line while the conductive line is selected, and for preventing a charging of the conductive line from the second control node.

BRIEF DESCRIPTION OF THE DRAWINGS

The foregoing aspects and advantages of the present invention will become better understood upon reading the following detailed description and upon reference to the drawings where:

FIG. 2-A shows an exemplary charge pump circuit according to the preferred embodiment of the present invention.

FIG. 2-B shows another exemplary charge pump circuit according to the present invention.

DETAILED DESCRIPTION OF THE INVENTION

In the following description, unless stated otherwise, the term "conductive line" is understood to refer to word lines and bit lines. The statement that some action is performed while a conductive line is selected is understood to mean that the action is performed while the conductive line is in a selected state, and not necessarily at the same time the conductive line changes its state from de-selected to selected. The term "device" is used to refer to transistor devices. A set of elements is understood to include one or more elements.

The following description illustrates embodiments of the invention by way of example and not necessarily by way of limitation.

Figure 1:
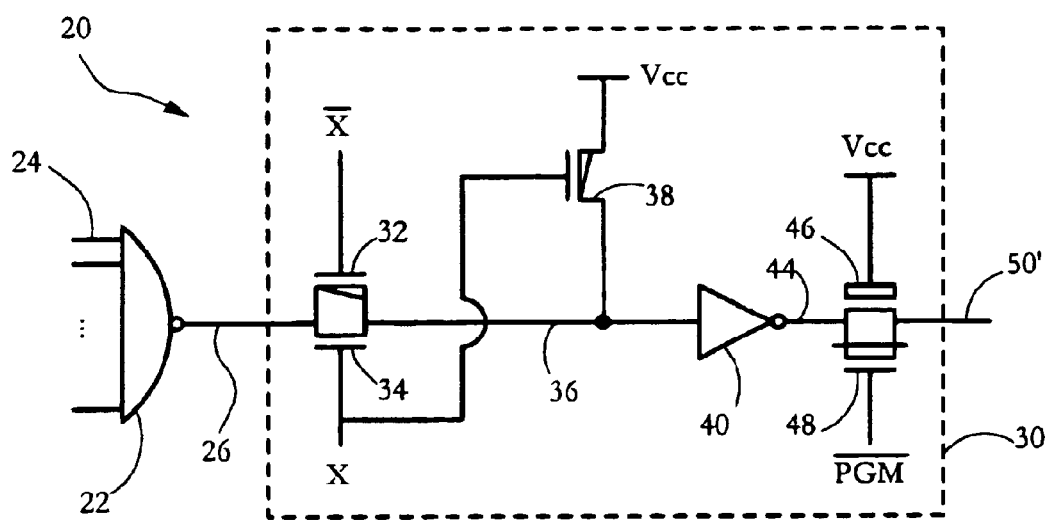
FIG. 1 shows a preferred word line pre-decoder and decoder, according to an embodiment of the present invention.

FIG. 1 shows a pre-decoding/decoding circuit 20 suitable for use in the present invention. Circuit 20 comprises a NAND gate 22 serving as a word line pre-decoder. Gate 22 has multiple address line inputs 24 and a single pre-decoder output 26. Pre-decoder output 26 is selected (logic 0 level) when all inputs 24 are selected, and it is de-selected (logic 1 level) if any of inputs 24 is de-selected.

Pre-decoder output 26 is connected to an input of a word line decoder circuit 30. Decoder circuit 30 comprises an enhancement p-channel device 32 and an enhancement n-channel device 34. The sources of devices 32 and 34 are connected to pre-decoder output 26, and the drains of devices 32, 34 are connected to an internal decoder node 36. The gates of devices 32, 34 are connected to external X and $\overline{X}$ decoder inputs, respectively. The signals X and $\overline{X}$ are generated by a conventional multiple level decoding circuit, and are derived from X-address lines other than those used for inputs 24.

An enhancement p-channel device 38 has its source connected to an operating voltage $V_{cc}$, its drain connected to node 36, and its gate connected to the X input. The operating voltage $V_{cc}$ is preferably between 1 and 5 V, e.g. about 2.5 V or about 5 V, depending on the implementation. Device 38 serves as a de-select device. An inverter 40 has its input connected to node 36, and its output connected to a node 44. Node 44 is connected to the common sources of an enhancement device 46 and a depletion (e.g. −1 V threshold) device 48. The gates of devices 46 and 48 are connected to $V_{cc}$ and to a $\overline{PGM}$ input, respectively. The common drains of devices 46, 48 are connected to a word line 50'.

Decoder 30 receives signals X, $\overline{X}$, $\overline{PGM}$, and a signal from pre-decoder output 26 as its inputs, and generates an output signal on word line 50'. Decoder 30 can be better understood by considering its operation when word line 50' is selected and de-selected.

When word line 50' is to be de-selected, $\overline{X}$ is charged to $V_{cc}$, X is pulled to ground, and $\overline{PGM}$ remains unchanged at $V_{cc}$. Devices 32 and 34 are cut off so the signal at node 26 does not pass on to node 36. Device 38 is turned on by the X signal at its gate, and pulls up node 36 to $V_{cc}$. Inverter 40 sets node 44 to ground. Device 46 is on, as long as both word line 50' and node 44 are under $V_{cc}$. Devices 46 and 48 pull word line 50' to the voltage of node 44, which is ground.

When word line 50' is to be selected, $\overline{X}$ is pulled to ground, X is charged to $V_{cc}$, and $\overline{PGM}$ remains unchanged at $V_{cc}$. Node 26 is at ground. Devices 32 and 34 are on, and device 38 is off. The signal at node 26 passes on to node 36 through devices 32 and 34. Inverter 40 sets node 44 to $V_{cc}$. Devices 46 and 48 are on, and charge word line 50' to $V_{cc}$.

At the onset of programming, $\overline{PGM}$ is discharged to ground. Device 48 is then off. Word line 50' remains at $V_{cc}$ due to its inherent capacitance, illustrated as a capacitor 51 in FIG. 2-A. When word line 50' is pumped to higher voltages as described below, device 46 prevents charge from flowing from word line 50' to node 44. Device 46 operates in a tri-state mode during programming FIG. 2-A shows an exemplary self-decoding charge pump circuit 52 according to a preferred embodiment of the present invention. Charge pump circuit 52 may be integrated on a chip, shown schematically at 53. Charge pump 52 is self-decoding, i.e. it is turned on and off by the voltage on its corresponding conductive line. Charge pump 52 may comprise an on-chip conventional high-voltage generator circuit 54 for generating a high voltage $V_{pp}$ at a high-voltage generator output 58. The high-voltage $V_{pp}$ is preferably between 10 and 20 V, e.g. about 15 V. The high voltage $V_{pp}$ is higher than the operating voltage $V_{cc}$. High voltage output 58 is employed as a high voltage source for charging a conductive line 50 as described below. High-voltage generator 54 is connected to conventional on-chip or off-chip control logic (not shown) through a control line 60, for receiving enable signals controlling generator 54 to turn on/off. Charge pump 52 may also further comprise an on-chip oscillator circuit 62 for generating voltage pulses of amplitude $V_{osc}=V_{cc}$ at an oscillator output 64. The output of oscillator 62 is a square wave varying between 0 V and $V_{osc}$, with a frequency on the order of several hundered kHz to 10 MHz and finite rise/fall times. Oscillator 62 is connected to on-chip or off-chip control logic over a control line 65, for receiving enable signals controlling oscillator 62 to turn on/off. Suitable high-voltage generators, oscillators, and corresponding control circuits are known in the art.

A first charge transfer control device 66 has its gate and drain connected together to a first control node 68, and its source connected to a first control node 50a. Device 66 is preferably an n-channel enhancement device with a threshold voltage $V_{t1}$, between 0 V and 0.3 V. A second charge-transfer control device 72 has its drain, gate, and source connected to high-voltage generator output 58, second control node 50a, and first control node 68, respectively. Device 72 is preferably an enhancement device with a threshold voltage $V_{t2}$ between 0.4 V and 1.5 V, for example 1 V.

An oscillator output capacitive coupling circuit 79 is used to selectively couple voltage pulses generated by oscillator 62 to first control node 68 when conductive line 50 is selected. Capacitive coupling circuit 79 preferably comprises an oscillator output control device 76 and a passive capacitor 80. Oscillator-output control device 76 has its drain connected to oscillator output 64, and its gate connected to charge transfer node 68. Device 76 is preferably an enhancement device with a threshold voltage $V_{t3}$ between 0.4 V and 1.5 V, for example 1 V. Capacitor 80 has an input connected to the source of device 76, and an output connected to charge transfer node 68. Capacitor 80 is preferably a large-area, in-plane parallel plate capacitor having an ONO (silicon dioxide, silicon nitride, silicon dioxide) dielectric sandwiched between top and bottom polysilicon plates. Other suitable dielectrics include silicon dioxide (e.g. gate oxide), silicon nitride, and aluminum oxide. The surface area of capacitor 80 is preferably at least an order of magnitude (factor of 10) larger than the gate areas of device 66. The use of a passive capacitor for capacitively coupling oscillator output 64 to charge transfer node 68 allows a reduction in carrier injection into the semiconductor substrate. Such carrier injection could lead to reduced pumping efficiency for charge pump 52, particularly if a large gate surface area were to be used to increase the capacitive coupling between oscillator output 64 and charge transfer node 68. Alternatively, capacitive coupling circuit 79 may be formed solely by device 76 with its gate and source connected together to first control node 68, and its drain connected to oscillator output 64.

A conductive line isolation device 67 connects conductive line 50 to second control node 50a. Isolation device 67 is used to charge second control node 50a from conductive line 50 when conductive line 50 is selected. Isolation device 67 also prevents the transfer of charge directly from second control node 50a to conductive line 50 during the process of charging conductive line 50, such that the voltage increase on second control node 50a resulting from the capacitive coupling of voltage pulses across capacitive circuit 79 is substantially independent of the capacitance of conductive line 50. Isolation device 67 is preferably an n-channel enhancement device with a threshold voltage $V_{t1}$ between 0 and 0.3 V.

A conductive line charging control device 73 connects high voltage source 58 to conductive line 50, so as to allow the charging of conductive line 50 from high voltage source 58 in response to the voltage on second control node 50a. Charging control device 73 has a drain connected to high voltage source 58, a source connected to word line 50, and a gate connected to second control node 50a. Charging control device 73 is preferably an enhancement device having a threshold voltage $V_{t3}$ between 0.4 and 1.5 V.

When conductive line 50 is de-selected (at ground), device 67 discharges second control node 50a to conductive line 50 (ground), and device 66 discharges first control node 68 to second control node 50a (ground). Devices 72 and 73 are off, isolating high voltage source 58 from first control node 68 and conductive line 50, respectively. Similarly, device 76 is off, isolating oscillator output 64 from capacitor 80 and first control node 68. Thus, unselected conductive lines do not draw substantial amounts of current from generator 58 or oscillator 64. If the threshold voltage $V_{t3}$ of device 76 is larger than the threshold voltage $V_{t1}$ of device 66, spurious charge accumulation on first control node 68 should not trigger the pumping of second control node 50a when conductive line 50 is de-selected. Moreover, charge accumulation on second control node 50a should not trigger the charging of conductive line 50 through device 73 when conductive line 50 is de-selected, since node 50a is discharged to ground through device 67 when conductive line 50 is de-selected.

In read mode, high voltage source 58 is kept at $V_{cc}$ (e.g, 2.5 V or 5 V). Oscillator 62 is off and oscillator output 64 is at ground. Conductive line 50 is charged to $V_{cc}$ if selected, and kept at ground if de-selected. If conductive line 50 is at ground, second control node 50a stays at ground, and devices 73, 72, 76, and 66 are all off. There is no current path between high voltage source 58 and conductive line 50. If conductive line 50 is at $V_{cc}$, second control node 50a is charged from conductive line 50 through conductive line isolation device 67 until it is a voltage $V_{t1}$ below conductive line 50. Conductive line charging control device 73 is off, since its gate voltage is below its drain and source voltages. When second control node 50a reaches the sum of the threshold voltages of devices 72 and 76 ($V_{t2}+V_{t3}$), oscillator output control device 76 turns on. Charge transfer control device 66 is off, since its gate voltage is below its source voltage by $V_{t3}$. No current flows through devices 72 and 66.

In programming mode, high voltage source 58 is maintained at $V_{pp}$ (e.g. 15 V). If conductive line 50 is de-selected, it is held at ground. Second control node 50a is at ground, and devices 72 and 73 are off. First control node 68 is also at ground, and device 76 is off. Conductive line 50 is not pumped if de-selected.

If selected for programming, conductive line 50 charged to $V_{cc}$, (e.g. 2.5 V or 5 V) by decoder 30 (shown in FIG. 1). As the programming signal $\overline{PGM}$ goes low, generator 54 and oscillator 62 (shown in FIG. 2-A) are turned on by enable signals received over connections 60 and 65, respectively. Second control node 50a follows conductive line 50 until second control node 50a is a voltage $V_{t1}$ (the threshold voltage of device 67) below $V_{cc}$. First control node 68 follows second control node 50a to a voltage $V_{t2}$ (the threshold voltage of device 72) below second control node 50a. Device 76 is on when first control node 68 reaches a voltage $V_{t3}$ and second control node 50a reaches $V_{t2}+V_{t3}$, the sum of the threshold voltages of devices 72 and 76. Capacitive coupling circuit 79 capacitively couples voltage pulses from oscillator output 64 to first control node 68. As oscillator output 64 ramps up from ground, device 76 allows the input of capacitor 80 to be charged. As the input of capacitor 80 charges up, the voltage on first control node 68 is capacitively coupled up, preferably primarily through capacitor 80. As the voltage on first control node 68 increases beyond the sum of the voltage on second control node 50a and the threshold voltage $V_{t1}$ of device 66, device 66 begins transferring charge to second control node 50a. Second control node 50a is charged through device 66 until oscillator output 64 achieves its maximum voltage. As the voltage on oscillator output 64 decreases, device 72 transfers charge from high-voltage generator output 58 to first control node 68, preventing first control node 68 from decreasing to its previous level. When oscillator output 64 reaches ground at the end of a cycle, the voltages on first control node 68 and second control node 50a are higher than at the beginning of the cycle.

Device 73 turns on as the voltage on second control node 50a increases by $V_{t1}$ above the voltage on conductive line 50, allowing charge to flow from high voltage source 58 to conductive line 50. As the voltage on second control node 50a rises above $V_{cc}$, device 67 remains off since its gate voltage is lower than or equal to its drain or source voltages. The voltage change induced on second control node 50a by the capacitively-coupled voltage pulses is substantially independent of the capacitance of conductive line 50.

Figure 3:
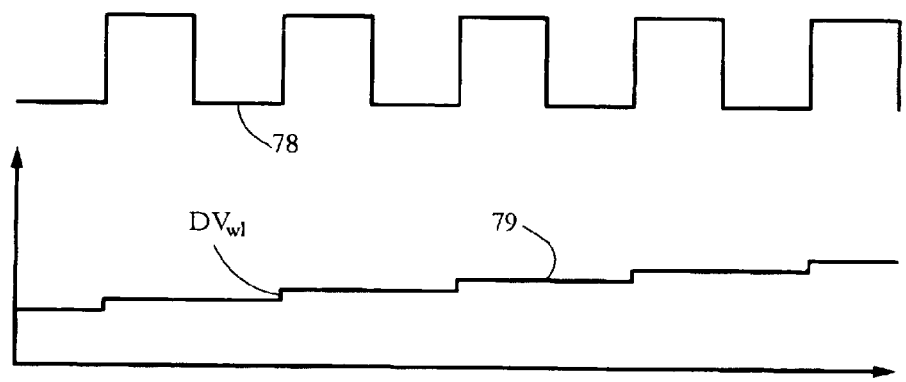
FIG. 3 illustrates the incremental charging of a selected conductive line according to the present invention.

FIG. 3 illustrates the incremental charging of conductive line 50 over a number of cycles of oscillator 62. The upper square wave 78 represents the voltage at oscillator output 64, while the lower stairstep 79 represents the voltage on conductive line 50. The voltage on conductive line 50 raises incrementally by a voltage difference $\Delta V_{w1}$, for each positive voltage swing at oscillator output 64. On the negative oscillator output voltage swing at the end of a cycle, the transfer of a charge increment from high-voltage source 58 to first control node 68 prevents the voltage on first control node 68 from returning from its value at the start of the cycle. At the same time, device 66 prevents the discharge of second control node 50a to the voltage of first control node 68.

The positive voltage swing at oscillator output 64 can be broken down into two parts: a first voltage swing $\Delta V_{osc1}$ while device 66 is off, and a second voltage swing $\Delta V_{osc2}=V_{cc}-\Delta V_{osc1}$ while device 66 is on. The voltage swing $\Delta V_{osc1}$ required on oscillator output 64 to raise the initial potential of charge transfer node 68 by a voltage difference $\Delta V_{cm}$ while device 66 is off is $$\Delta V_{osc1}=\Delta V_{cin}(C_{eq}(76,80)+C_{eq}(66))/C_{eq}(76,80), \quad [1a]$$

where $C_{eq}(76,80)$ is the equivalent capacitance of device 76 and capacitor 80 as measured between oscillator output 64 and charge transfer node 68, and C(66) is the gate-to-substrate capacitance of device 66. The voltage swing required on oscillator output 64 for raising the potential of second control node 50a by ~1 V ($V_{t1}+V_{t2}$, i.e. until device 66 starts charging second control node 50a) is $$\Delta V_{osc1}=1V(C_{eq}(76,80)+C(66))/C(76,80). \quad [1]$$

After device 66 starts charging second control node 50a, oscillator output 64 undergoes a remaining voltage swing $$\Delta V_{osc2}=V_{cc}-\Delta V_{osc1}. \quad [2]$$

The incremental increase in the potential of second control node 50a per positive oscillator voltage swing is $$\Delta V_{50a} \cong \left[ V_{cc} - (V_{t2}+V_{t1})\frac{C_{eq}(76,80)+C(66)}{C_{eq}(76,80)} \right] \times \frac{C_{eq}(76,80)}{C_{eq}(76,80)+C(66)+C(50a)}, \quad [3]$$

where C(50a) is the capacitance of second control node 50a, $V_{t2}$ is the threshold voltage of device 72 and $V_{t1}$ is the threshold voltage of device 66. If we assume, for illustrative purposes, that $$C_{eq}(76,80) \cong 10*C(66), \quad [4a]$$

$$C_{eq}(76,80) \cong 5*C(50a) \quad [4b]$$

then eq. [3] can be re-written as 8/9

$$\Delta V_{50a} \cong \frac{[V_{cc} - 1.1(V_{t2} + V_{t1})]}{1.6}. \quad [5]$$

As described above, the voltage on conductive line 50 follows the voltage on second control node 50a as conductive line 50 is charged through device 73. From eq. [5] it can be seen that charging up second control node 50a (and hence conductive line 50) requires a relatively low number of clock cycles. A relatively low capacitance (and thus surface area) may be employed for capacitor 80 while still maintaining a desired level of pumping efficiency.

The equations above illustrate that the efficiency of pumping conductive line 50 depends on the capacitance of second control node 50a, rather than the capacitance of conductive line 50. The capacitance of second control node 50a is given principally by the gate capacitances of devices 72 and 73, and the source-to-gate and substrate capacitance of device 67. In an exemplary implementation, the capacitance of conductive line 50 is on the order of $10^{-12}$ F, while the capacitance of node 50a is on the order of $10^{-15}$ F. Thus, the use of devices 67 and 73 allows a substantial increase in the speed of charging conductive line 50. The second control node 50a can be thought of as a primary charge pump output, used to control the charging of conductive line 50, a secondary charge pump output. The pumping efficiency of pump 52 then depends primarily on the efficiency of the primary pump.

The configuration shown in FIG. 2-A can be readily implemented using only n-channel devices. Such an implementation may allow the use of a smaller die area than an implementation requiring the use of both n-channel and p-channel devices, since a charge pump employing only-n-channel devices is not subject to a layout penalty resulting from minimum spacing requirements between n-channel and p-channel devices.

Device 72 serves to control the transfer of charge from high-voltage generator 54 to first control node 68 when conductive line 50 is selected, and to prevent the transfer of charge from high-voltage generator 54 to first control node 68 when conductive line 50 is de-selected. Thus, device 72 helps ensure that high-voltage generator 54 does not leak current through de-selected conductive lines. Device 66 serves to control the transfer of charge from first control node 68 to second control node 50a when conductive line 50 is selected, and in particular to prevent the transfer of charge from second control node 50a to first control node 68 on the negative voltage swings of oscillator 62. Device 66 further serves to ground first control node 68 when conductive line 50 is de-selected, thus cooperating with device 76 to isolate oscillator 62 from capacitor 80 when conductive-line 50 is de-selected. Device 76 serves to control the coupling of oscillator output 64 to first control node 68. Device 76 allows the voltage pulses generated by oscillator 62 to pass on to capacitor 80 and first control node 68 only if conductive line 50 is selected.

Preferably, the capacitive coupling between oscillator output 64 and charge transfer node 68 occurs primarily through capacitor 80, although there may be some limited gate-to-drain capacitive coupling through device 76. The relatively large capacitance of capacitor 80 allows the use of a small device 76, and allows limiting the carrier injection produced by device 76. In an exemplary implementation, capacitor 80 has a capacitance on the order of 300 fF, while device 76 has a capacitance on the order of 0.03 pF. By contrast, if the gate surface of an active device such as device 76 were to be used for capacitively coupling oscillator output 64 to first control node 68, the large gate surface area required for obtaining a desired capacitance would lead to significantly increased carrier injection.

FIG. 2-B illustrates another self-decoding charge pump 152 according to the present invention. Charge pump 152 differs from charge pump 52 (shown in FIG. 2-A) in that the drain of device 73 is connected to a high voltage source ($V_{pp}$) through a global charging control device 74 having its gate connected to a global charging control line (control ramp node) 75. Device 74 is activated by the assertion of a global control signal on control line 75. Global control line 75 can be connected in parallel to multiple similar conductive lines 50. Device 74 can be identical to device 73, i.e. an n-channel enhancement device having a threshold voltage $V_{t3}$ between 0.4 and 1.5 V. Device 74 can be used to place an upper bound on the speed with which conductive line 50 is charged. Charging conductive line 50 too fast can lead to potential damage to the tunnel dielectric of the memory cells connected to conductive line 50. In one implementation, the global control signal applied to control line 75 follows an RC-type ramp up with an RC time constant between 50 and 100 $\mu$s, for example about 80 $\mu$s. Conductive line 50 cannot charge up faster than the ramping up of global control line 75, and potential damage to the memory cells connected to conductive line 50 is prevented. As in the embodiment described above, charge pump 152 is turned on and off by the voltage on conductive line 50. Turning on charge pump 152 leads to charging only control node 50a unless global charging control device 74 is on.

Figure 4:
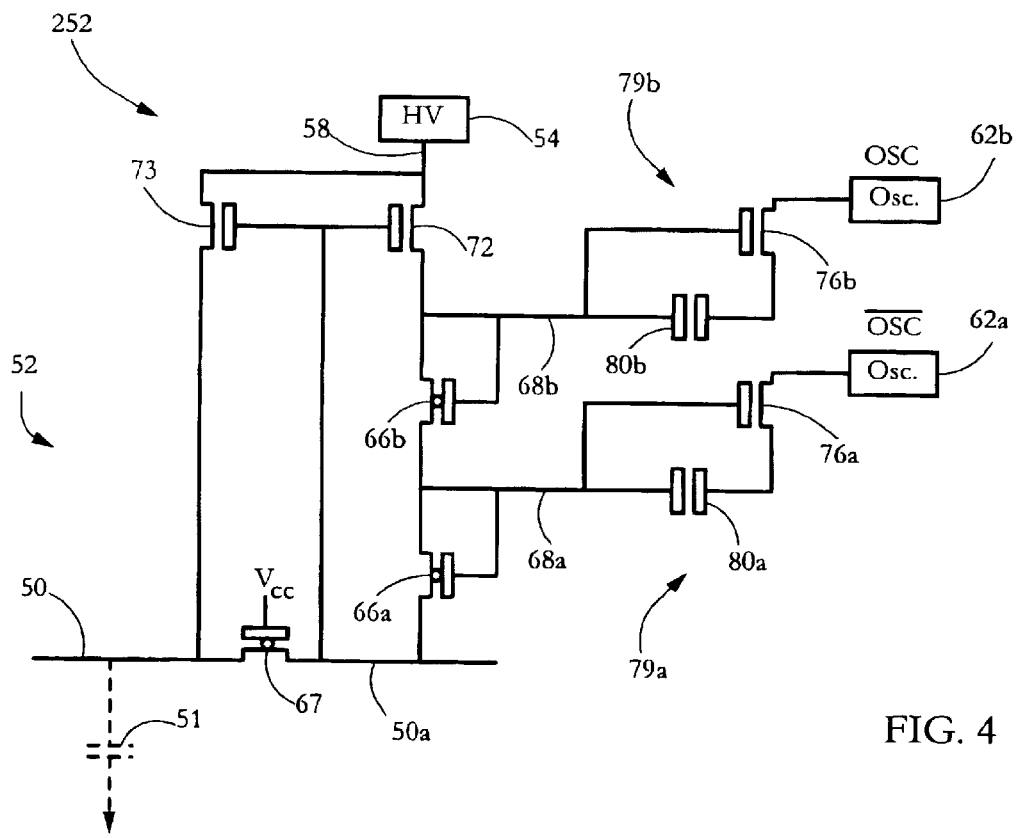
FIG. 4 illustrates an alternative charge pump circuit of the present invention.

FIG. 4 shows a charge pump 252 comprising plural oscillators for controlling the transfer of charge from high-voltage generator 54 to second control node 50a, according to an alternative embodiment of the present invention. Charge pump 252 comprises plural charge transfer/control nodes 68a–b connected in series between high-voltage generator 54 and second control node 50a. Charge transfer nodes 68a–b are connected as described above to corresponding oscillators 62a–b through capacitors 80a–b and devices 76a–b, respectively. Oscillators 62a–b generate out-of-phase voltage pulses OSC and $\overline{OSC}$, respectively. The drain and gate of device 66a are connected to charge transfer node 68a, while the source of device 66a is connected to second control node 50a. The gate and drain of device 66b are connected to charge transfer node 68b, while the source of device 66b is connected to charge transfer node 68a. Device 66b controls the connection between charge transfer nodes 68a and 68b. The drain and source of device 72 are connected to high-voltage generator output 58 and charge transfer node 68b, respectively. Device 72 controls the connection between high-voltage generator output 58 and charge transfer node 68b.

The devices connected to charge transfer nodes 68a–b cooperate in a push-pull fashion to generate a relatively large voltage swing across device 66b, relative to the voltage swing across device 66 illustrated in FIG. 2-A. Charge is first transferred from high-voltage generator output 58 to charge transfer node 68b, subsequently from charge transfer node 68b to charge transfer node 68a, and subsequently from charge transfer node 68a to second control node 50a.

The configuration of FIG. 4 allows the use of oscillator voltage pulses of smaller amplitude than the configuration of FIG. 2-A. As illustrated by eq. [5], charging second control node 50a in the configuration of FIG. 2-A requires that the oscillator output voltage be higher than the sum of the threshold voltages of devices 66 and 72. Moreover, the threshold voltage of device 66 increases with the voltage on second control node 50a. The configuration of FIG. 4 can be used to relax the constraint imposed on the oscillator output voltage swing by the threshold voltage of device 66.

It will be clear to one skilled in the art that the above embodiments may be altered in many ways without departing from the scope of the invention. For example, p-channel devices may be used instead on n-channel devices. Accordingly, the scope of the invention should be determined by the following claims and their legal equivalents.

What is claimed is:

1. A self-decoding apparatus integrated on a chip for selectively charging conductive lines of a programmable non-volatile memory array for programming, comprising:

oscillator output capacitive coupling circuitry connecting an oscillator output to a first control node corresponding to a selected conductive line, the capacitive coupling circuitry being responsive to a voltage on the first control node, for capacitively coupling voltage pulses from the oscillator output to the first control node while the conductive line is selected;

control selective charge transfer circuitry connecting a high voltage source to a second control node through the first control node, the second control node corresponding to the conductive line and having a lower capacitance than the conductive line, for selectively transferring charge increments from the high-voltage source to the second control node while the conductive line is selected, in response to the voltage pulses received at the first control node and in response to a voltage on the second control node;

conductive line charging control circuitry connecting the high voltage source to the conductive line and responsive to the second control node, for selectively transferring charge from the high voltage source to the conductive line while the conductive line is selected, in response to the voltage on the second control node;and conductive line isolation circuitry connecting the conductive line to the second control node, for selectively charging the second control node from the conductive line while the conductive line is selected, and for preventing a charging of the conductive line from the second control node.

2. The apparatus of claim 1, wherein the control charge transfer circuitry comprises:

a first charge transfer control device having a gate and a drain connected to the first charge transfer node, and a source connected to the second control node;and a second charge transfer control device having a gate connected to the second control node, a drain connected to the high voltage source, and a source connected to the first control node.

3. The apparatus of claim 1, wherein the conductive line isolation circuitry comprises an isolation device having a drain connected to the conductive line, a source connected to the second control node, and a gate held at an operating voltage $V_{cc}$.

4. The apparatus of claim 3, wherein the conductive line charging control circuitry comprises a conductive line charging control device having a drain connected to the high voltage source, a source connected to the conductive line, and a gate connected to the second control node.

5. The apparatus of claim 4, wherein the conductive line charging control circuitry further comprises a global charging control device connecting the drain of the conductive line charging control device to the high voltage source, the global charging control device having a gate connected to a global control line for receiving a global control signal.

6. The apparatus of claim 5, wherein the oscillator output capacitive coupling circuitry comprises:

an oscillator output control device having a drain connected to the oscillator output, a gate connected to the first control node, and a source; and a passive capacitor connected between the source of the oscillator output control device and the first control node.

7. The apparatus of claim 6, wherein each of the isolation device, conductive line charging control device, and global charging control device is an n-channel device.

8. The apparatus of claim 1, further comprising the high voltage source, the oscillator, and a conductive line decoder connected to the conductive line for selecting the conductive line for programming.

9. The apparatus of claim 1, wherein each of the control selective charge transfer circuitry, conductive line charging control circuitry, and conductive line isolation circuitry is formed by a set of n-channel devices.

10. The apparatus of claim 1, wherein the conductive line is a word line.

11. A self-decoding apparatus integrated on a chip for selectively charging conductive lines of a programmable non-volatile memory array for programming, comprising:

a conductive line decoder connected to a conductive line of the array, for selecting the conductive line;

a high voltage source for providing a high voltage;

an oscillator for providing voltage pulses;

oscillator output capacitive coupling circuitry connecting the oscillator to a first control node corresponding to the conductive line, the capacitive coupling circuitry being responsive to a voltage on the first control node, for capacitively coupling the voltage pulses to the first control node if the conductive line is selected;

control selective charge transfer circuitry connecting the high voltage source to a second control node through the first control node, the second control node corresponding to the conductive line and having a lower capacitance than the conductive line, for selectively transferring charge increments from the high-voltage source to the second control node while the conductive line is selected, in response to the voltage pulses received at the first control node and in response to a voltage on the second control node;

conductive line charging control circuitry connecting the high voltage source to the conductive line and responsive to the second control node, for selectively transferring charge from the high voltage source to the conductive line while the conductive line is selected, in response to the voltage on the second control node; and conductive line isolation circuitry connecting the conductive line to the second control node, for selectively charging the second control node from the conductive line while the conductive line is selected, and for preventing a charging of the conductive line from the second control node.

12. A self-decoding apparatus integrated on a chip for selectively charging conductive lines of a programmable non-volatile memory array for programming, comprising:

oscillator output capacitive coupling means connecting an oscillator output to a first control node corresponding to a selected conductive line, the capacitive coupling means being responsive to a voltage on the first control node, for capacitively coupling voltage pulses from the oscillator output to the first control node while the conductive line is selected for programming;

control selective charge transfer means connecting a high voltage source to a second control node through the first control node, the second control node corresponding to the conductive line and having a lower capacitance than the conductive line, for selectively transferring charge increments from the high-voltage source to the second control node while the conductive line is selected, in response to the voltage pulses received at the first control node and in response to a voltage on the second control node;

conductive line charging control means connecting the high voltage source to the conductive line and responsive to the second control node, for selectively transferring charge from the high voltage source to the conductive line while the conductive line is selected, in response to the voltage on the second control node; and conductive line isolation means connecting the conductive line to the second control node, for selectively charging the second control node from the conductive line while the conductive line is selected, and for preventing a charging of the conductive line from the second control node.

13. A self-decoding apparatus integrated on a chip for selectively charging conductive lines of a programmable non-volatile memory array for programming, comprising:

a capacitor connecting an oscillator output to a first control node corresponding to a selected conductive line, for capacitively coupling voltage pulses from the oscillator output to the first control node;

a first charge transfer control device having a gate and a drain connected to the first charge transfer node, and a source connected to a second control node, for transferring charge from the first control node to the second control node while the conductive line is selected for programming, in response to the voltage pulses received at the first control node and in response to a voltage on the second control node, wherein the second control node corresponds to the conductive line and has a lower capacitance than the conductive line;

a second charge transfer control device having a gate connected to the second control node, a drain connected to the high voltage source, and a source connected to the first control node, for selectively transferring charge increments from the high-voltage source to the first control node while the conductive line is selected for programming, in response to the voltage pulses received at the first control node and in response to a voltage on the second control node;

a conductive line charging control device having a drain connected to the high voltage source, a source connected to the conductive line, and a gate connected to the second control node, for selectively transferring charge from the high voltage source to the conductive line while the conductive line is selected; and an isolation device having a drain connected to the conductive line, a source connected to the second control node, and a gate held at an operating voltage $V_{cc}$, for for selectively charging the second control node from the conductive line while the conductive line is selected, and for preventing a charging of the conductive line from the second control node.

14. A method of selectively charging conductive lines of a programmable non-volatile memory array for programming, comprising:

selecting a conductive line for programming;

charging a second control node from the conductive line through a conductive line isolation device, the second control node corresponding to the conductive line and having a lower capacitance than the conductive line;

charging a first control node from a high voltage source in response to a voltage on the second control node, the first control node corresponding to the conductive line;

capacitively coupling voltage pulses from an oscillator output to the first control node in response to the charging of the first control node;

transferring charge increments from the high voltage source to the second control node through the first control node in response to the voltage pulses coupled to the first control node and in response to the voltage on the second control node, while preventing a charging of the conductive line from the second control node;

charging the conductive line from the high voltage source under control of the voltage on the second control node.

15. The method of claim 14, further comprising:

asserting a global control signal over a plurality of global control lines each corresponding to one of the conductive lines of the array; and charging the conductive line from the high voltage source under the control of the global control signal, wherein a controlled time-dependence of the global control signal places an upper bound on a charging period for the conductive line.

* * * * *